US012464691B2

(12) United States Patent
Sasahara et al.

(10) Patent No.: US 12,464,691 B2
(45) Date of Patent: Nov. 4, 2025

(54) POWER CONVERSION DEVICE

(71) Applicant: Mitsubishi Electric Corporation, Tokyo (JP)

(72) Inventors: Ryoko Sasahara, Tokyo (JP); Manabu Yoshimura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 263 days.

(21) Appl. No.: 18/030,274

(22) PCT Filed: Dec. 2, 2020

(86) PCT No.: PCT/JP2020/044831
§ 371 (c)(1),
(2) Date: Apr. 5, 2023

(87) PCT Pub. No.: WO2022/118391
PCT Pub. Date: Jun. 9, 2022

(65) Prior Publication Data
US 2023/0378885 A1  Nov. 23, 2023

(51) Int. Cl.
*H05K 9/00* (2006.01)
(52) U.S. Cl.
CPC ............ *H05K 9/00* (2013.01); *H05K 9/0071* (2013.01)
(58) Field of Classification Search
CPC .... H05K 9/00; H05K 9/0071; H05K 7/14339; H02M 7/003; Y02E 60/60
See application file for complete search history.

(56) References Cited

U.S. PATENT DOCUMENTS

2020/0113093 A1   4/2020  Nakabayashi et al.

FOREIGN PATENT DOCUMENTS

| CN | 106558864 A | 4/2017 |
| CN | 106710946 A | 5/2017 |
| CN | 107194102 A | 9/2017 |
| CN | 107507717 A | 12/2017 |
| CN | 110854823 A | 2/2020 |

(Continued)

OTHER PUBLICATIONS

International Search Report and Written Opinion mailed on Feb. 2, 2021, received for PCT Application PCT/JP2020/044831, filed on Dec. 2, 2020, 8 pages including English Translation.

(Continued)

*Primary Examiner* — Imani N Hayman
*Assistant Examiner* — Hung Q Dang
(74) *Attorney, Agent, or Firm* — XSENSUS LLP

(57) ABSTRACT

This power conversion device includes a plurality of power conversion units, a first electric field relaxation shield, a second electric field relaxation shield, and a third electric field relaxation shield. The first, the second and the third electric field relaxation shield include a first end, a second end and a third end, respectively. The first electric field relaxation shield and the second electric field relaxation shield surround the plurality of power conversion units when viewed from a direction in which the first electric field relaxation shield and the third electric field relaxation shield are overlapped each other. The third end is disposed at any position within a range from a position overlapping the first end to a position overlapping the second end when viewed from the direction in which the first electric field relaxation shield and the third electric field relaxation shield are overlapped each other.

13 Claims, 18 Drawing Sheets

(56) References Cited

FOREIGN PATENT DOCUMENTS

| CN | 110957930 A | 4/2020 |
|---|---|---|
| JP | 57-162455 A | 10/1982 |
| JP | 3-86790 U | 9/1991 |
| WO | 2019/003432 A1 | 1/2019 |

OTHER PUBLICATIONS

Extended European Search Report issued Dec. 5, 2023 in European Patent Application No. 20964245.3, 26 pages.

POWER CONVERSION DEVICE

CROSS-REFERENCE TO RELATED APPLICATION

The present application is based on PCT filing PCT/JP2020/044831, filed Dec. 2, 2020, the entire contents of which are incorporated herein by reference.

TECHNICAL FIELD

The present disclosure relates to a power conversion device.

BACKGROUND ART

A power conversion device used in a high voltage direct current (HVDC) power transmission system includes an AC-DC power conversion device. It is necessary for such an AC-DC power conversion device to secure withstand voltage performance against DC and AC operating voltages and voltages that enter the AC-DC power conversion device as surge voltages from a power system due to switch open/close, lightning strike, or the like. Therefore, some AC-DC power conversion devices include at least one electric field relaxation shield in order to protect at least one power conversion unit having a power conversion function. The at least one electric field relaxation shield is disposed between the at least one power conversion unit and the ground for the purpose of field relaxation. In a case where the AC-DC power conversion device includes a plurality of power conversion units, a potential difference is generated between the plurality of power conversion units. In a case where the AC-DC power conversion device includes a plurality of electric field relaxation shields, the plurality of electric field relaxation shields may have different potentials. The plurality of electric field relaxation shields includes a first electric field relaxation shield and a second electric field relaxation shield having different potentials.

For example, in a case where the potential of the first electric field relaxation shield becomes a floating potential equal or close to the potential of a power conversion unit close to the first electric field relaxation shield, and the potential of the second electric field relaxation shield becomes equal to the potential of a power conversion device unit close to the second electric field relaxation shield, a potential difference may be generated. The potential difference between the first electric field relaxation shield and the second electric field relaxation shield may increase in a manner that depends on the number and potential of the plurality of power conversion units. Furthermore, a high electric field may be generated between the first electric field relaxation shield and the second electric field relaxation shield due to the potential difference or a distance from a ground potential.

Further, in a case where a surge voltage is applied, the plurality of power conversion units, the first electric field relaxation shield, and the second electric field relaxation shield become equal in potential to each other.

A known a power conversion device further includes a third electric field relaxation shield disposed between the first electric field relaxation shield and a grounding object (ground) so as to relax an electric field generated when a surge voltage is applied. For example, Utility Model Laying-Open No. H03-86790 (PTL 1) discloses a high voltage thyristor valve (power conversion device) including a plurality of shields (the first electric field relaxation shield and the second electric field relaxation shield) surrounding a plurality of thyristor modules (power conversion units), and the other shield (the third electric field relaxation shield) disposed between the shields and the grounding object (ground). The other shield disposed between the shields and the ground relaxes the electric field generated when the surge voltage is applied.

CITATION LIST

Patent Literature

PTL 1: Utility Model. Laying-Open. No. 1103-86790

SUMMARY OF INVENTION

Technical Problem

In the power conversion device (high voltage thyristor valve) disclosed in PTL 1, the third electric field relaxation shield is disposed all over the periphery of the plurality of power conversion units. Therefore, in a case where a high electric field is generated between the first electric field relaxation shield and the second electric field relaxation shield due to a potential difference, the high electric field is further enhanced by the third electric field relaxation shield.

The present disclosure has been made in view of the above-described problems, and it is therefore an object of the present disclosure to provide a power conversion device capable of preventing a high electric field from being enhanced.

Solution to Problem

A power conversion device according to the present disclosure includes a plurality of power conversion units, a first electric field relaxation shield, a second electric field relaxation shield, and a third electric field relaxation shield. The plurality of power conversion units are disposed away from a grounding object that is at a ground potential. The first electric field relaxation shield is disposed between the grounding object and the plurality of power conversion units. The first electric field relaxation shield includes a first end. The second electric field relaxation shield includes a second end. The second end faces the first end with a gap. The second electric field relaxation shield is disposed between the grounding object and the plurality of power conversion units. The third electric field relaxation shield is disposed between the grounding object and the first electric field relaxation shield so as to be overlapped with the first electric field relaxation shield. The third electric field relaxation shield includes a third end. The first electric field relaxation shield and the second electric field relaxation shield surround the plurality of power conversion units when viewed from a direction in which the first electric field relaxation shield and the third electric field relaxation shield are overlapped each other. The third end is disposed at any position within a range from a position overlapping the first end to a position overlapping the second end when viewed from the direction in which the first electric field relaxation shield and the third electric field relaxation shield are overlapped each other.

Advantageous Effects of Invention

In the power conversion device according to the present disclosure, the third end is disposed at any position within a range from the position overlapping the first end to the position overlapping the second end in the direction in which the first electric field relaxation shield and the third electric field relaxation shield are overlapped each other. Therefore, a potential of the first electric field relaxation shield and a potential of the second electric field relaxation shield are shared by the third end of the third electric field relaxation shield, so that an electric field gradually spreads. It is therefore possible to prevent a high electric field from being enhanced.

DESCRIPTION OF EMBODIMENTS

Figure 1:
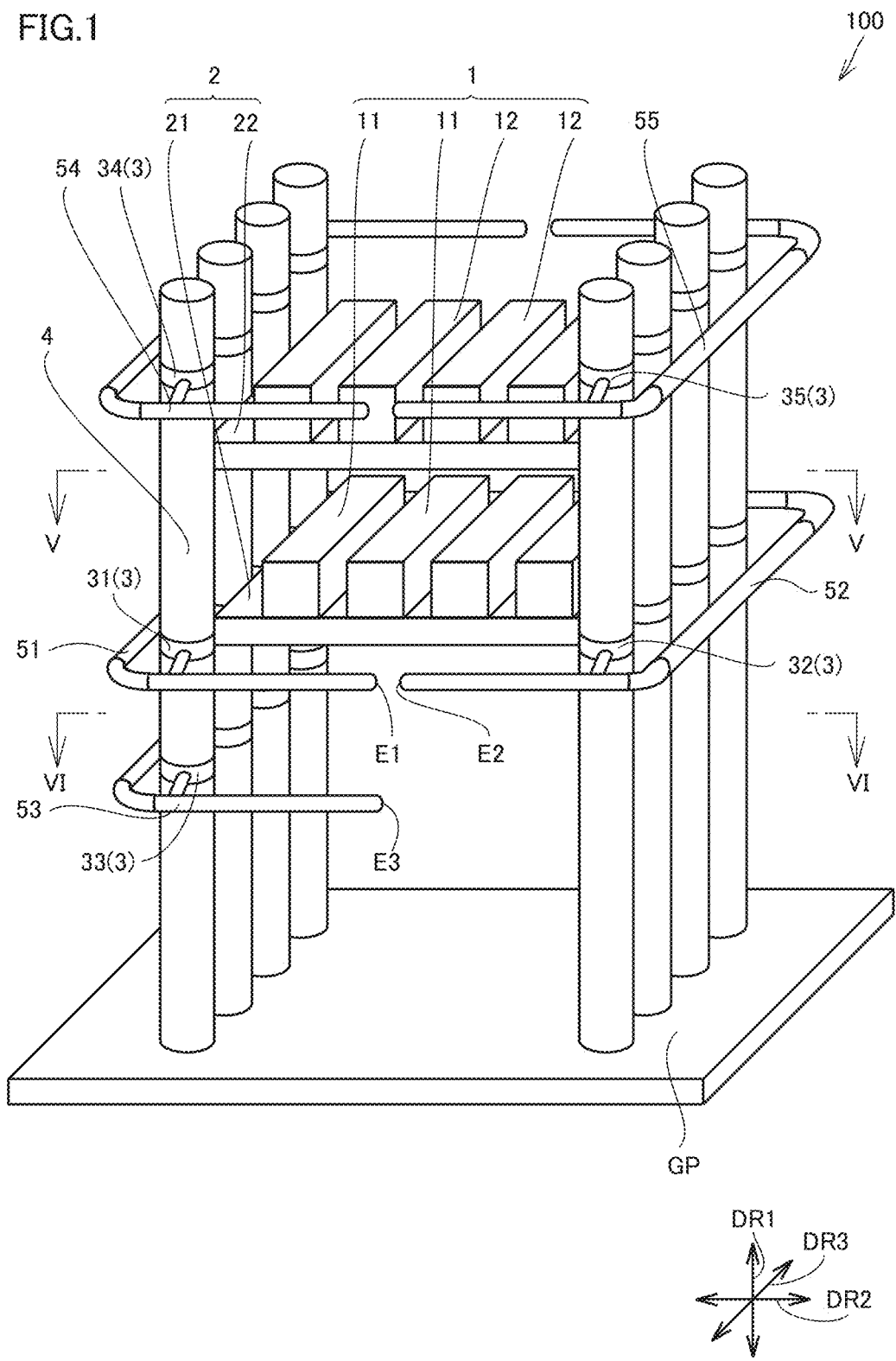
FIG. 1 is a schematic perspective view of a configuration of a power conversion device according to a first embodiment.

Hereinafter, embodiments will be described with reference to the drawings. Note that, in the following description, the same or corresponding parts are denoted by the same reference numerals to avoid the description from being redundant.

First Embodiment

With reference to FIGS. 1 to 8, a description will be given of a configuration of a power conversion device 100 according to a first embodiment.

As illustrated in FIG. 1, power conversion device 100 includes a plurality of power conversion units 1, a first electric field relaxation shield 51, a second electric field relaxation shield 52, and a third electric field relaxation shield 53. Power conversion device 100 may further include a support base 2, a support portion 3, a support column 4, a fourth electric field relaxation shield 54, and a fifth electric field relaxation shield 55. Power conversion device 100 is, for example, an AC-DC power conversion device that converts AC and DC.

According to the present embodiment, a first direction DR1 is a direction in which first electric field relaxation shield 51 and third electric field relaxation shield 53 are overlapped each other. A second direction DR2 is a direction in which first electric field relaxation shield 51 and second electric field relaxation shield 52 face each other. A third direction DR3 is a direction intersecting both first direction DR1 and second direction DR2. It is preferable that second direction DR2 be orthogonal to first direction DR1, It is preferable that third direction DR3 be orthogonal to first direction DR1 and second direction DR2.

Power conversion device 100 is disposed on or near a grounding object GP. Grounding object GP is, for example, a floor, a ceiling, a wall, or the like. According to the present embodiment, grounding object GP is illustrated as a floor. Grounding object GP is at a ground potential. It is preferable that grounding object GP be electrically connected to the ground so as to be at a zero potential (ground potential).

The plurality of power conversion units 1 are disposed away from grounding object GP that is at the ground potential. The plurality of power conversion units 1 may be electrically connected to each other. Note that, in FIG. 1, a connection terminal for electrically connecting the plurality of power conversion units 1 is not illustrated. In FIG. 1, power conversion device 100 includes, for example, eight power conversion units 1. Specifically, eight power conversion units 1 include four first power conversion unit portions 11 and four second power conversion unit portions 12. Four second power conversion unit portions 12 overlap four first power conversion unit portions 11 in first direction DR1. Four first power conversion unit portions 11 are arranged on a first support base portion 21 to be described later. Four second power conversion unit portions 12 are disposed on a second support base portion 22 to be described later. Note that the number and arrangement of the plurality of power conversion units 1 are not limited to the above. According to the present embodiment, a configuration where eight power conversion units 1 are arranged, four-by-four, in a row on two upper and lower stages is illustrated, but the present disclosure is not limited to the embodiment. For example, power conversion units 1 may be arranged in two or more rows in third direction DR3. Further, the plurality of power conversion units 1 may be arranged on three or more upper and lower stages. In a manner that depends on the number and arrangement of power conversion units 1, support base 2, support portion 3, support column 4, and the electric field relaxation shield to be described below may change in number and arrangement.

The plurality of power conversion units 1 may be different in potential from each other. Specifically, power conversion units 1 adjacent to each other may be different in potential from each other. For example, a power conversion unit 1 disposed adjacent to first electric field relaxation shield 51 rather than second electric field relaxation shield 52 may be higher in potential than a power conversion unit 1 disposed adjacent to second electric field relaxation shield 52 rather than first electric field relaxation shield 51. In this case, first electric field relaxation shield 51 is higher in potential than second electric field relaxation shield 52.

Support base 2 supports each of the plurality of power conversion units 1. Support base 2 is fixed to support column 4. Therefore, the plurality of power conversion units 1 are each supported by support column 4 via support base 2. The plurality of power conversion units 1 are each placed on support base 2. Support base 2 is made of an insulator. Examples of the material of support base 2 includes glass epoxy resin, casting epoxy resin, polyethylene, vinyl chloride, synthetic rubber made from silicon (Si) or fluorine (F), nylon, insulating ceramics, and other materials having electrical insulation properties. Therefore, the plurality of power conversion units 1 are each insulated by support base 2. One support base 2 may support each of the plurality of power conversion units 1, or a plurality of support bases 2 may each support a corresponding one of the plurality of power conversion units 1.

According to the present embodiment, support base 2 includes a first support base portion 21 and a second support base portion 22. Second support base portion 22 overlaps first support base portion 21 in the first direction (DR1). First support base portion 21 supports each of four first power conversion unit portions 11. Second support base portion 22 supports each of four second power conversion unit portions 12. support portion 3 includes a first support portion 31, a second support portion 32, a third support portion 33, a fourth support portion 34, and a fifth support portion 35.

First support portion 31 is fixed to support column 4. First electric field relaxation shield 51 is fixed to first support portion 31. Therefore, first electric field relaxation shield 51 is fixed to the support column by first support portion 31.

Second support portion 32 is fixed to support column 4. Second electric field relaxation shield 52 is fixed to second support portion 32. Therefore, second electric field relaxation shield 52 is fixed to the support column by second support portion 32.

Third support portion 33 is fixed to support column 4. Third electric field relaxation shield 53 is fixed to third support portion 33. Therefore, third electric field relaxation shield 53 is fixed to the support column by third support portion 33.

Fourth support portion 34 is fixed to support column 4. Fourth electric field relaxation shield 54 is fixed to fourth support portion 34. Therefore, fourth electric field relaxation shield 54 is fixed to the support column by fourth support portion 34.

Fifth support portion 35 is fixed to support column 4. Fifth electric field relaxation shield 55 is fixed to fifth support portion 35. Therefore, fifth electric field relaxation shield 55 is fixed to the support column by fifth support portion 35.

First support portion 31 and second support portion 32 are each electrically connected to each of the plurality of power conversion units 1. First support portion 31 and second support portion 32 each serve as an electrode of power conversion unit 1. First support portion 31 and second support portion 32 may be each directly connected to power conversion unit 1. First support portion 31, second support portion 32, and third support portion 33 may indirectly have a floating potential.

First support portion 31, second support portion 32, and third support portion 33 are each made of a conductor. Examples of the material of first support portion 31, second support portion 32, and third support portion 33 include aluminum (Al), copper (Cu), iron (Fe), stainless steel, or an alloy of aluminum (Al), copper (Cu), iron (Fe), or stainless steel, other metals, conductive plastics containing a carbon-based substance (carbon, graphite, carbon nanotube, graphene, or the like), conductive plastics containing a metal substance (silver (Ag), nickel (Ni), copper (Cu), aluminum (Al), tin (Sri), stainless steel, or iron (Fe)), and other conductive materials.

Support base 2, first support portion 31, second support portion 32, and third support portion 33 are supported by support column 4. Support column 4 is disposed on grounding object OP. Support column 4 holds support base 2 in the air. Therefore, electrodes of each of the plurality of power conversion units 1 placed on support base 2 are disposed away from grounding object GP.

Support column 4 is mainly formed of an insulator. Examples of the insulator of support column 4 include fiber reinforced plastics (FRP), glass epoxy resin, other epoxy resins, synthetic rubber made of polyethylene, vinyl chloride, silicon (Si), or fluorine (F), nylon, polymer glass, ceramic glass, or other electrically insulating materials.

Figure 2:
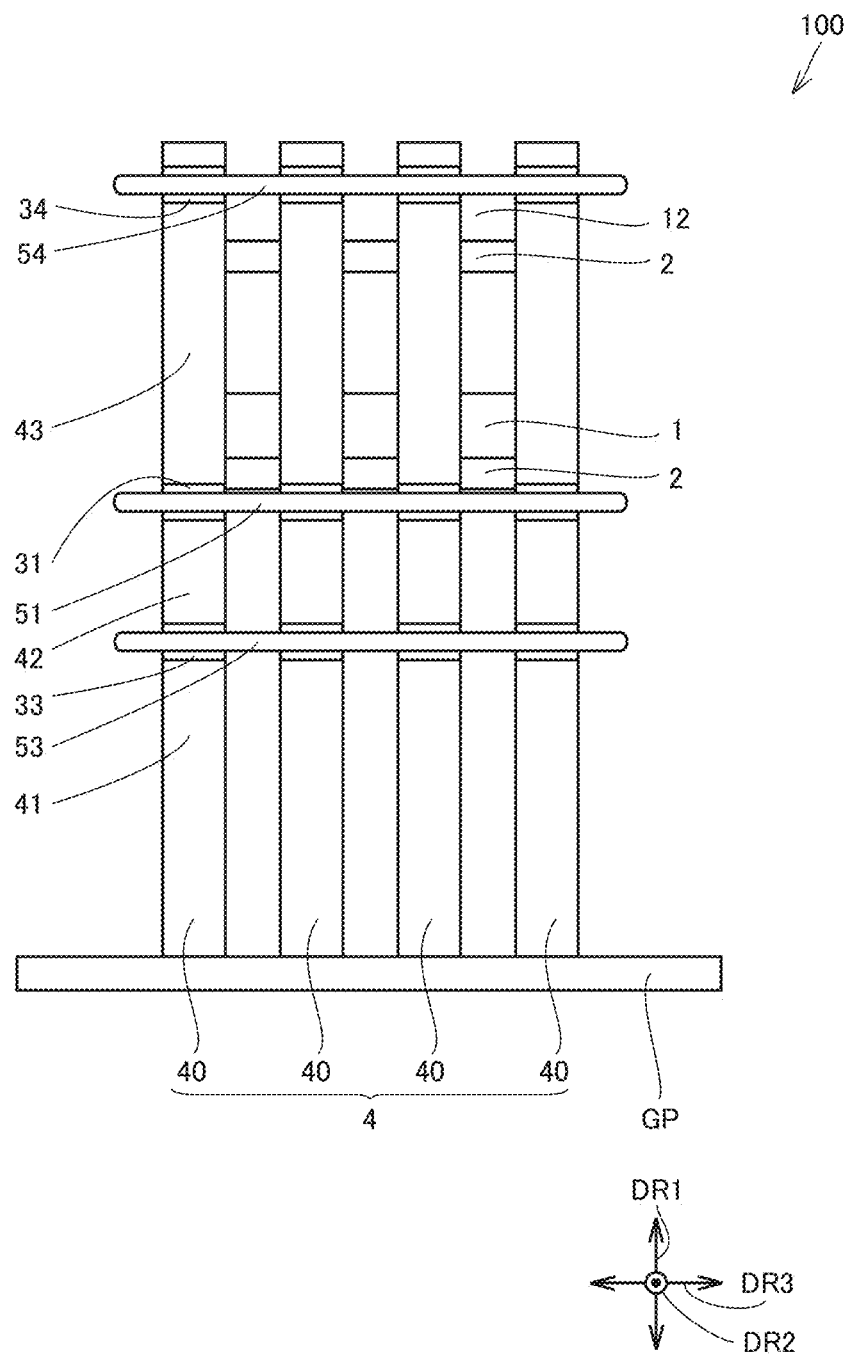
FIG. 2 is a schematic side view of the configuration of the power conversion device according to the first embodiment.

As illustrated in FIG. 2, support column 4 may include a plurality of support column portions 40. The plurality of support column portions 40 support support base 2. The plurality of support column portions 40 each include a first support column portion 41, a second support column portion 42, and a third support column portion 43. First support column portion 41 is disposed on grounding object GP. First support column portion 41 is mechanically connected to second support column portion 42 by third support portion 33. Second support column portion 42 overlaps first support column portion 41 in the direction (first direction DR1) in which first electric field relaxation shield 51 and third electric field relaxation shield 53 are overlapped each other. Second support column portion 42 is mechanically connected to third support column portion 43 by first support portion 31. Third support column portion 43 overlaps second support column portion 42 in the direction (first direction DR1) which first electric field relaxation shield 51 and third electric field relaxation shield 53 are overlapped each other.

Figure 3:
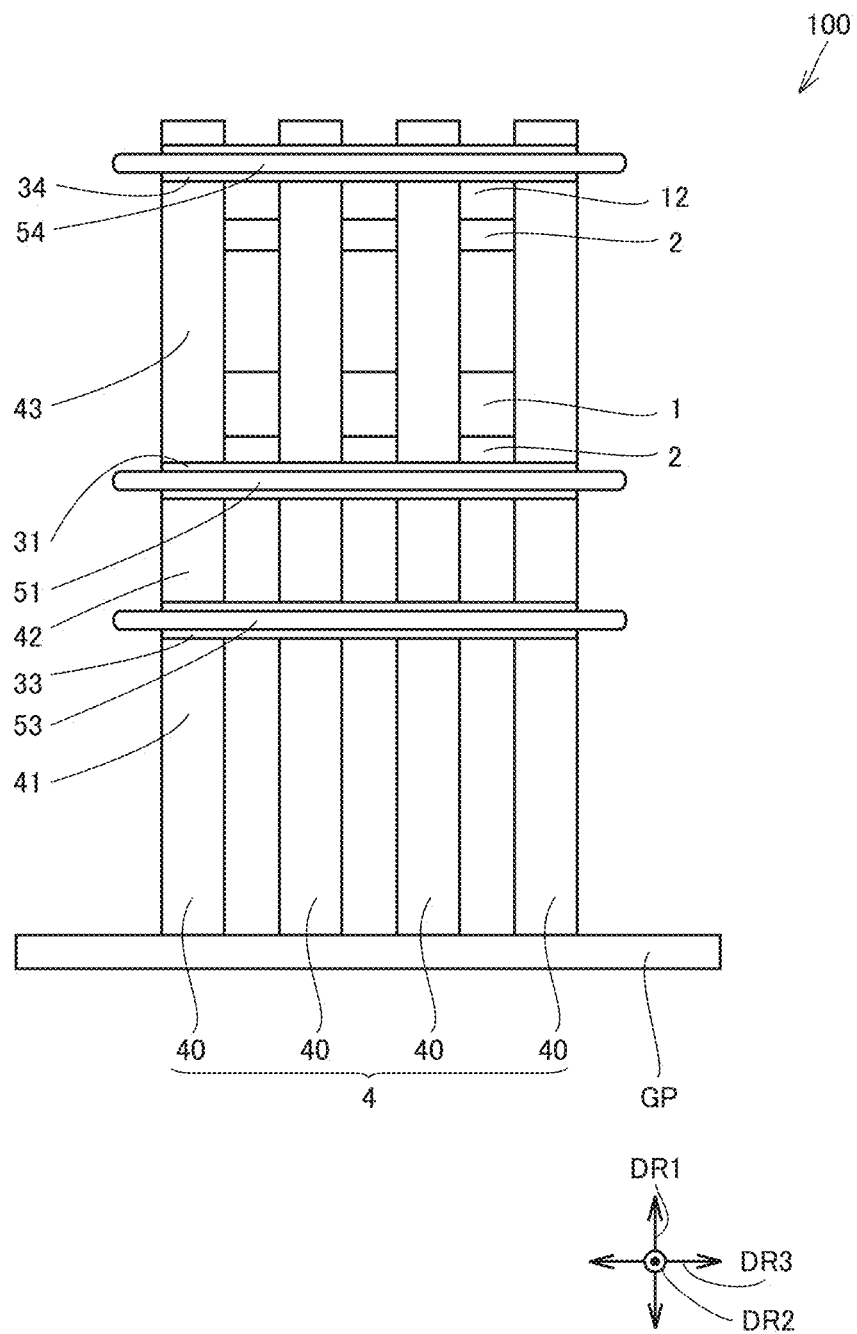
FIG. 3 is a schematic side view of a configuration of a power conversion device according to a modification of the first embodiment.

As illustrated in FIG. 3, first support portion 31 may connect support column portions 40 adjacent to each other. Further, third support portion 33 may connect support column portions 40 adjacent to each other. This increases resistance of support column 4 to earthquake.

There is a possibility that a surge voltage may be applied to power conversion device 100. The surge voltage is generated, for example, by an influence of operation of power conversion device 100 or an influence of operation of a peripheral device, lightning strike, or the like. In a case where the surge voltage or the operating voltage is applied to power conversion device 100, there is a possibility that an electric discharge may occur from the plurality of power conversion units 1, support base 2, or the like having a potential. There is a possibility that the electric discharge may advance toward grounding object GP. In a case where an electric discharge occurs from power conversion unit 1, and a ground fault occurs, there is a possibility that power conversion unit 1 may be electrically broken. First electric field relaxation shield 51 to fifth electric field relaxation shield 55 are provided for protecting power conversion units 1.

Figure 4:
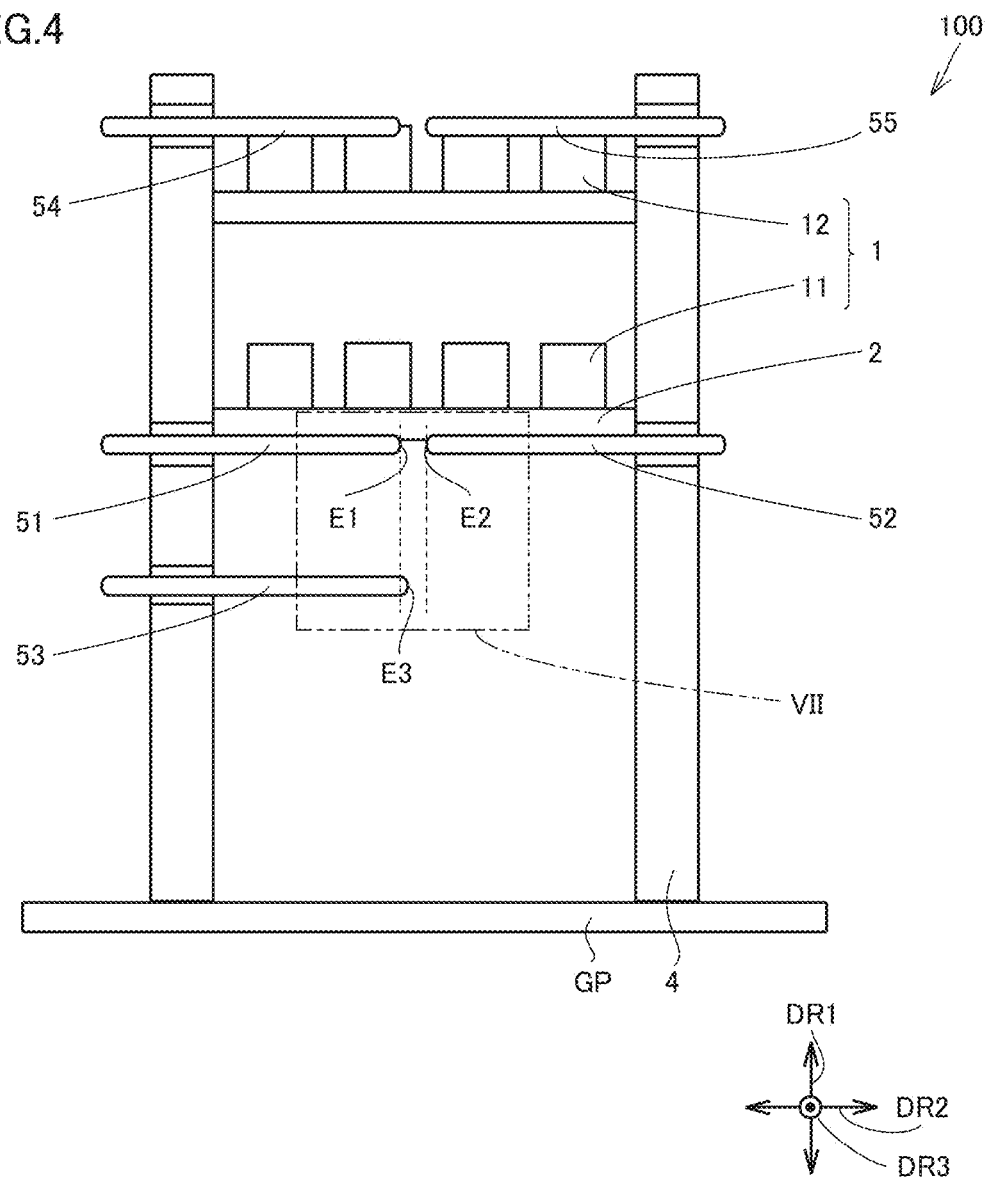
FIG. 4 is a schematic front view of the configuration of the power conversion device according to the first embodiment.

As illustrated in FIG. 4, first electric field relaxation shield 51, second electric field relaxation shield 52, and third electric field relaxation shield 53 are each disposed between the plurality of power conversion units 1 and grounding object GP (ground) in order to prevent the occurrence of an electric discharge toward grounding object GP. First electric field relaxation shield 51 to fifth electric field relaxation shield. 55 each serve as an electric field relaxation shield for relaxing an electric field.

First electric field relaxation shield 51 is disposed between grounding object GP and the plurality of power conversion units 1. Second electric field relaxation shield 52 is disposed between grounding object GP and the plurality of power conversion units 1. Third electric field relaxation shield 53 is disposed between grounding object GP and the first electric field relaxation shield 51 so as to be overlapped with first electric field relaxation shield 51. First electric field relaxation shield 51, second electric field relaxation shield 52, and third electric field relaxation shield 53 are each disposed adjacent to grounding object GP relative to lower ends of the plurality of power conversion units 1.

First electric field relaxation shield 51, second electric field relaxation shield 52, and third electric field relaxation shield 53 are disposed apart from each other. That is, first electric field relaxation shield 51, second electric field relaxation shield 52, and third electric field relaxation shield 53 are not in contact with each other. First electric field relaxation shield 51, second electric field relaxation shield 52, and third electric field relaxation shield 53 are separated from each other.

First electric field relaxation shield 51 and second electric field relaxation shield 52 are electrically connected to the plurality of power conversion units 1 by a connection member (not illustrated). This may cause a potential difference between first electric field relaxation shield 51 and second electric field relaxation shield 52 due to a potential difference between the plurality of power conversion units.

According to the present embodiment, first electric field relaxation shield 51 is higher in potential than second electric field relaxation shield 52. Specifically, first electric field relaxation shield 51 is higher in potential than second electric field relaxation shield 52 while the plurality of power conversion units 1 are in operation. Note that first electric field relaxation shield 51 and second electric field relaxation shield 52 are relatively determined in a manner that depends on which of the two electric field relaxation shields facing each other is higher in potential while the plurality of power conversion units 1 are in operation. Further, even in a case where the plurality of power conversion units 1 are surrounded by three or more electric field relaxation shields, first electric field relaxation shield 51 and second electric field relaxation shield 52 are determined in a manner that depends on the magnitude of the relative potential between the two electric field relaxation shields facing each other.

It is desirable that third electric field relaxation shield 53 be lower in potential than first electric field relaxation shield 51 and second electric field relaxation shield 52. Specifically, third electric field relaxation shield 53 is lower in potential than first electric field relaxation shield 51 and second electric field relaxation shield 52 while the plurality of power conversion units 1 are in operation. Third electric field relaxation shield 53 is insulated from the plurality of power conversion units 1. That is, third electric field relaxation shield 53 is not electrically connected to the plurality of power conversion units 1. Therefore, third electric field relaxation shield 53 has a floating potential.

For example, fourth electric field relaxation shield 54 and fifth electric field relaxation shield 55 are disposed around second power conversion unit portions 12. Fourth electric field relaxation shield 54 faces fifth electric field relaxation shield 55 with a gap. Fourth electric field relaxation shield 54 and fifth electric field relaxation shield 55 are identical in shape to first electric field relaxation shield 51 and second electric field relaxation shield 52, Fourth electric field relaxation shield 54 and fifth electric field relaxation shield 55 are connected to support column 4 by fourth support portion 34 (see FIG. 1) and fifth support portion 35 (see FIG. 1), respectively. Fourth electric field relaxation shield 54 and fifth electric field relaxation shield 55 are disposed so as to relax an electric field to the ground. As with first electric field relaxation shield 51 and second electric field relaxation shield 52, a potential difference may be generated between fourth electric field relaxation shield 54 and fifth electric field relaxation shield 55. Fourth electric field relaxation shield 54 and fifth electric field relaxation shield 55, however, are located apart from grounding object GP relative to first electric field relaxation shield 51 and second electric field relaxation shield 52. Further, a potential difference between fourth electric field relaxation shield 54 and fifth electric field relaxation shield 55 is small. This prevents an electric field as high as the electric field between the first relaxation shield and the second relaxation shield from being generated around fourth electric field relaxation shield 54 and fifth electric field relaxation shield 55.

Figure 5:
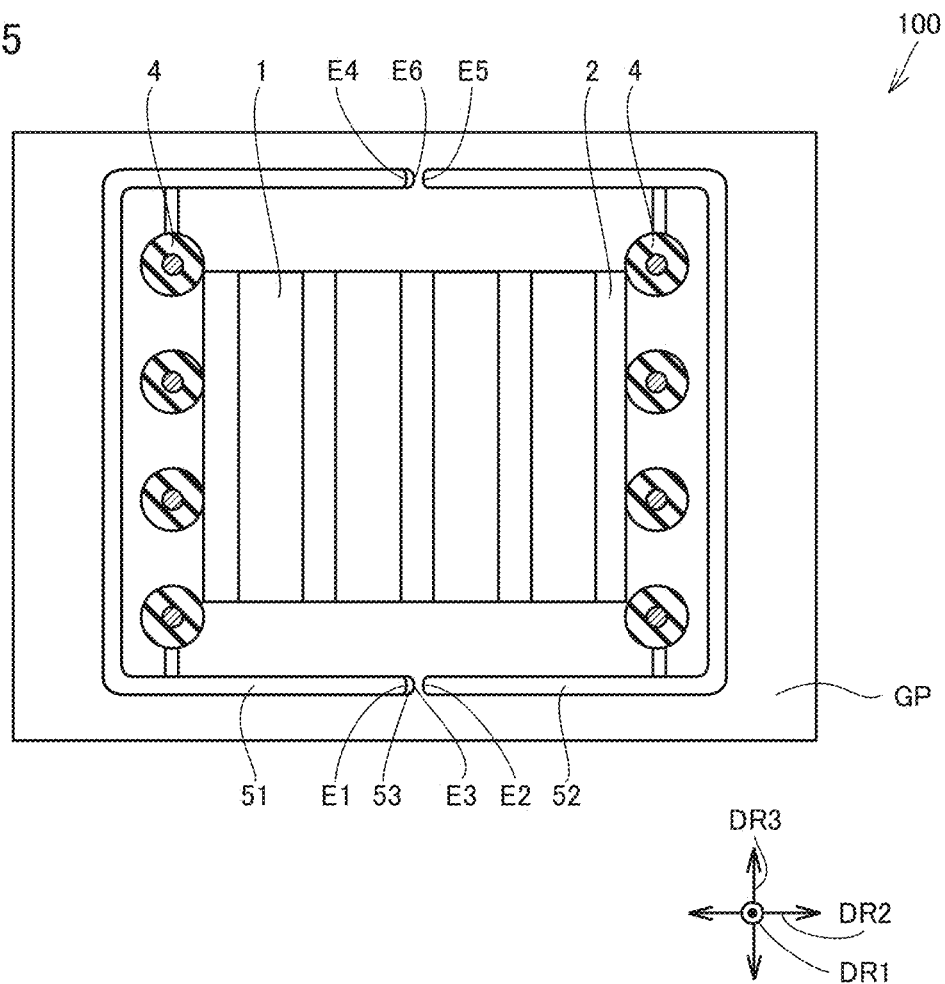
FIG. 5 is a cross-sectional view taken along a lime V-V in FIG. 1.

As illustrated in FIG. 5, first electric field relaxation shield 51 and third electric field relaxation shield 53 surround the plurality of power conversion units 1 when viewed from the direction (first direction DR1) in which first electric field relaxation shield 51 and second electric field relaxation shield 52 are overlapped each other. That is, in a case where power conversion device 100 is viewed from first electric field relaxation shield 51 toward third electric field relaxation shield 53, first electric field relaxation shield 51 and second electric field relaxation shield 52 surround the plurality of power conversion units 1. First electric field relaxation shield 51 faces second electric field relaxation shield 52 with a gap. A length of third electric field relaxation shield 53 is longer or equal to a length of first electric field relaxation shield 51. The gap between first electric field relaxation shield 51 and second electric field relaxation shield 52 is provided in second direction DR2.

First electric field relaxation shield 51 includes a first end E1 and a fourth end E4. Fourth end E4 is an end opposite to first end E1.

Second electric field relaxation shield 52 includes a second end E2 and a fifth end E5. Second end E2 faces first end. E1 with a gap. The direction (second direction DR2) in which first end E1 and second end E2 face each other coincides with second direction DR2. Fifth end E5 is an end opposite to second end E2. Fifth end E5 faces fourth end E4 with a gap.

Third electric field relaxation shield 53 includes a third end E3 and a sixth end E6. Third end E3 is disposed adjacent to grounding object GP relative to first end E1 and second end E2. Sixth end E6 is an end opposite to third end E3. Sixth end E6 is disposed adjacent to grounding object GP relative to fourth end E4 and fifth end E5.

Third end E3 of third electric field relaxation shield 53 is disposed at any position within a range from a position overlapping first end E1 to a position overlapping second end E2 when viewed from the direction (first direction DR1) in which first electric field relaxation shield 51 and third electric field relaxation shield 53 are overlapped each other. Sixth end E6 is disposed at any position within a range from a position overlapping fourth end E4 to a position overlapping fifth end E5 when viewed from the direction (first direction DR1) in which first electric field relaxation shield 51 and third electric field relaxation shield 53 are overlapped each other.

Figure 6:
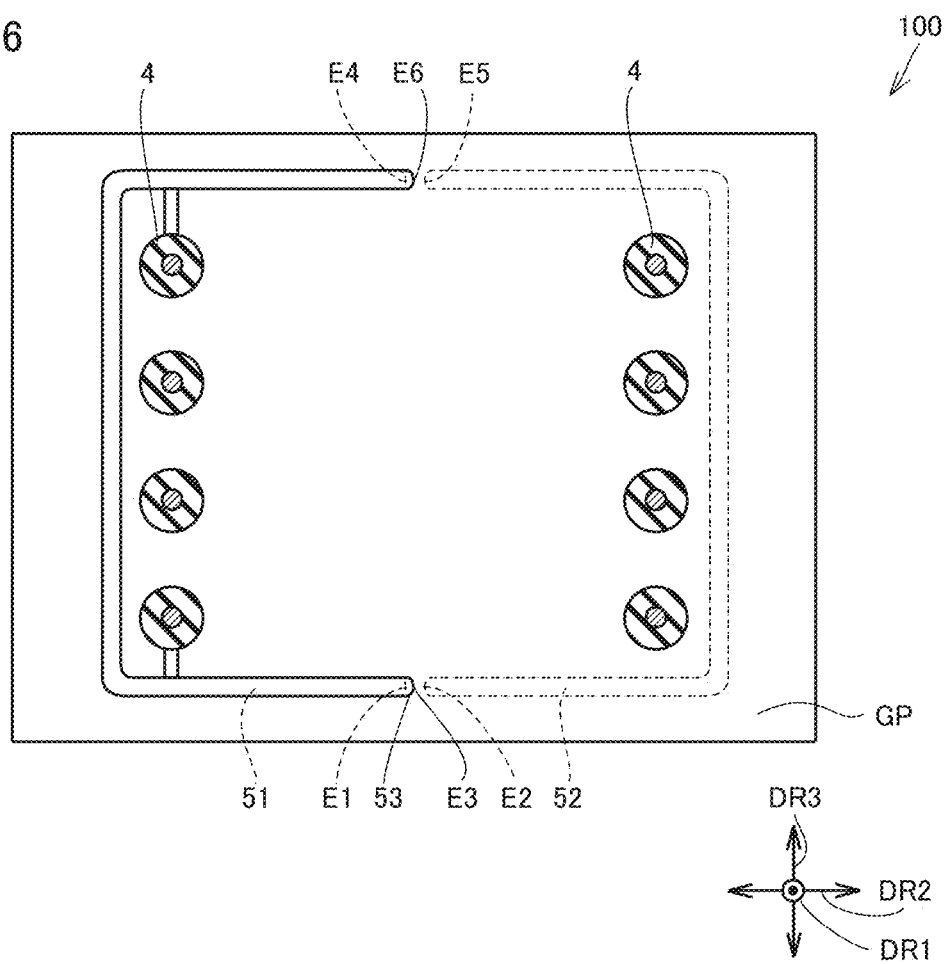
FIG. 6 is a cross-sectional view taken along a line VI-VI in FIG. 1.

As illustrated in FIG. 6, first electric field relaxation shield 51 overlaps third electric field relaxation shield 53. Note that, in FIG. 6, an outline of first electric field relaxation shield 51 and an outline of second electric field relaxation shield 52 are indicated by dashed lines.

Figure 7:
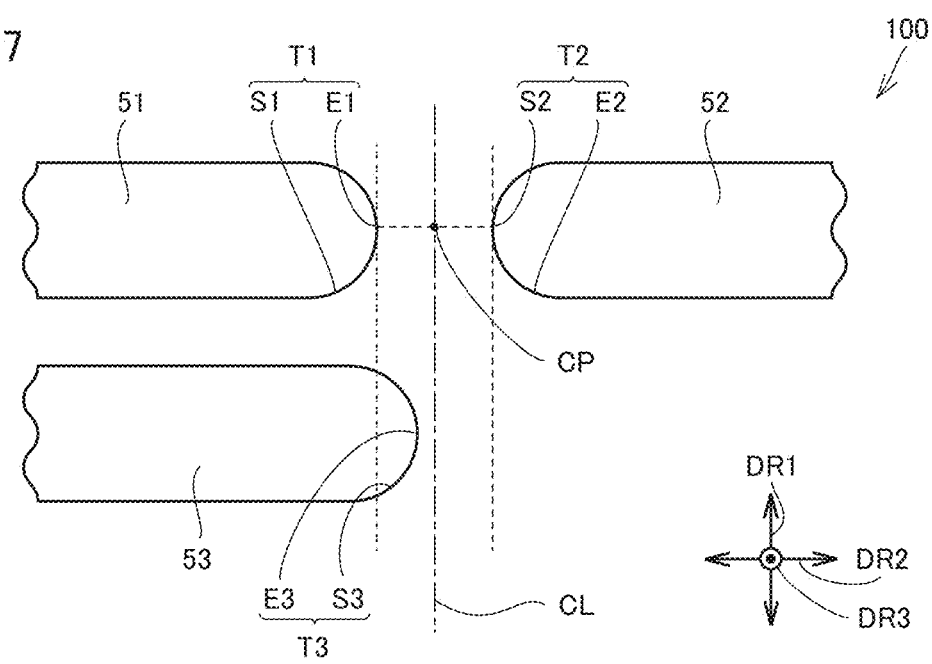
FIG. 7 is an enlarged view of a region VII in FIG. 4.

As illustrated in FIG. 7, a center line CL passing through, in first direction DR1, a center point CP between first end E1 and second end E2 in second direction DR2 is located between first end E1 and second end E2. In FIG. 7, center line CL is indicated by a long dashed short dashed line. It is preferable that third end E3 of third electric field relaxation shield 53 be disposed at any position within a range from the position overlapping first end E1 to a position overlapping center point CP between first end E1 and second end E2 when viewed from the direction (first direction DR1) in which first electric field relaxation shield 51 and third electric field relaxation shield 53 are overlapped each other. Note that, in FIG. 7, support base 2 is not illustrated for convenience of description.

It is more preferable that third end E3 of third electric field relaxation shield 53 protrude beyond the position overlapping first end E1 toward the position overlapping second end E2 when viewed from the direction (first direction DR1) in which first electric field relaxation shield 51 and third electric field relaxation shield 53 are overlapped each other. It is more preferable that third end E3 of third electric field relaxation shield 53 is disposed adjacent to first end E1 relative to the position overlapping center point CP in the direction (first direction DR1) in which first electric field relaxation shield 51 and third electric field relaxation shield 53 are overlapped each other.

First electric field relaxation shield 51 includes a first termination portion T1. First end E1 is a distal end of first termination portion T1. First termination portion T1 has a first side surface S1. First side surface S1 faces third electric field relaxation shield 53.

Second electric field relaxation shield 52 includes a second termination portion T2. Second end E2 is a distal end of second termination portion T2. Second termination portion T2 has a second side surface S2, Second side surface S2 faces grounding object GP (see FIG. 1).

Third electric field relaxation shield 53 includes a third termination portion T3. Third end E3 is a distal end of third termination portion T3. Third termination portion. T3 has a third side surface S3. Third side surface S3 faces grounding object GP (see FIG. 1).

First termination portion T1, second termination portion T2, and third termination portion T3 each have a hemispherical shape. Further, first termination portion T1, second termination portion T2, and third termination portion T3 may each have a round shape like a side surface of a cylinder. First termination portion T1, second termination portion T2, and third termination portion T3 may each have, for example, a ring shape formed by rounding a cylinder. First termination portion T1, second termination portion T2, and third termination portion T3 may each have any shape as long as a portion facing the ground potential has a round shape. First termination portion T1, second termination portion T2, and third termination portion T3 may be identical in shape to or different in shape from each other.

Figure 8:
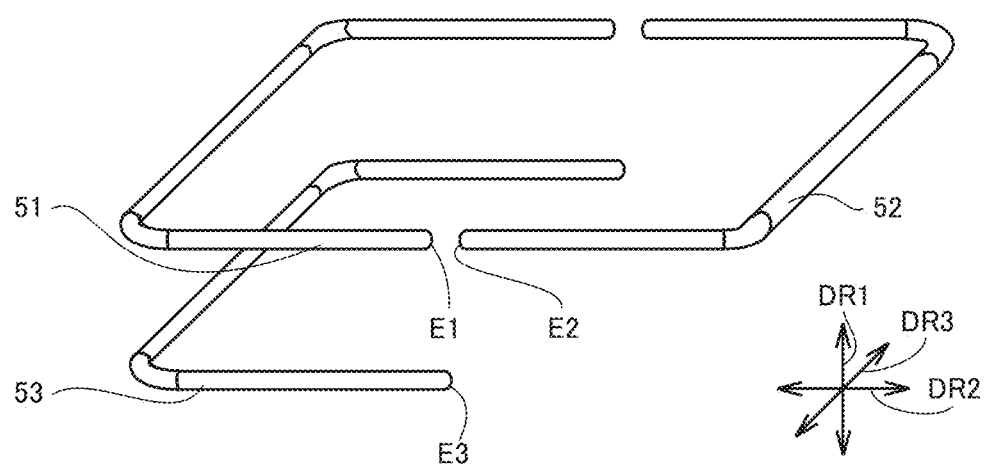
FIG. 8 is a schematic perspective view of configurations of a first electric field relaxation shield, a second electric field relaxation shield, and a third electric field relaxation shield of the power conversion device according to the first embodiment.

As illustrated in FIG. 8, first electric field relaxation shield 51, second electric field relaxation shield 52, and third electric field relaxation shield 53 are each formed of a cylindrical member. The member of which first electric field relaxation shield 51, second electric field relaxation shield 52, and third electric field relaxation shield 53 are each formed is not limited to such a cylindrical member, and may be, for example, a plate-shaped member or a hollow member (cylindrical member).

First electric field relaxation shield 51, second electric field relaxation shield 52, and third electric field relaxation shield 53 are each made of a conductor. Examples of the material of first electric field relaxation shield 51, second electric field relaxation shield 52, and third electric field relaxation shield 53 include aluminum (Al), copper (Cu), iron (Fe), stainless steel or an alloy of aluminum (Al), copper (Cu), iron (Fe), or stainless steel, other metals, conductive plastics containing a carbon-based substance carbon, graphite, carbon nanotube, graphene, or the like), conductive plastics containing a metal substance (silver (Ag), nickel (Ni), copper (Cu), aluminum (Al), tin (Sn), stainless steel, or iron (Fe)), and other conductive materials. First electric field relaxation shield 51, second electric field relaxation shield 52, and third electric field relaxation shield 53 may be made of the same material or different materials.

First electric field relaxation shield 51, second electric field relaxation shield 52, and third electric field relaxation shield 53 each have a U-shape. Second electric field relaxation shield 52 may have so as to make first electric field relaxation shield 51 are second electric field relaxation shield 52 mirror-symmetrical. It is preferable that third electric field relaxation shield 53 be disposed parallel to first electric field relaxation shield 51.

Next, actions and effects of the present embodiment will be described.

Figure 9:
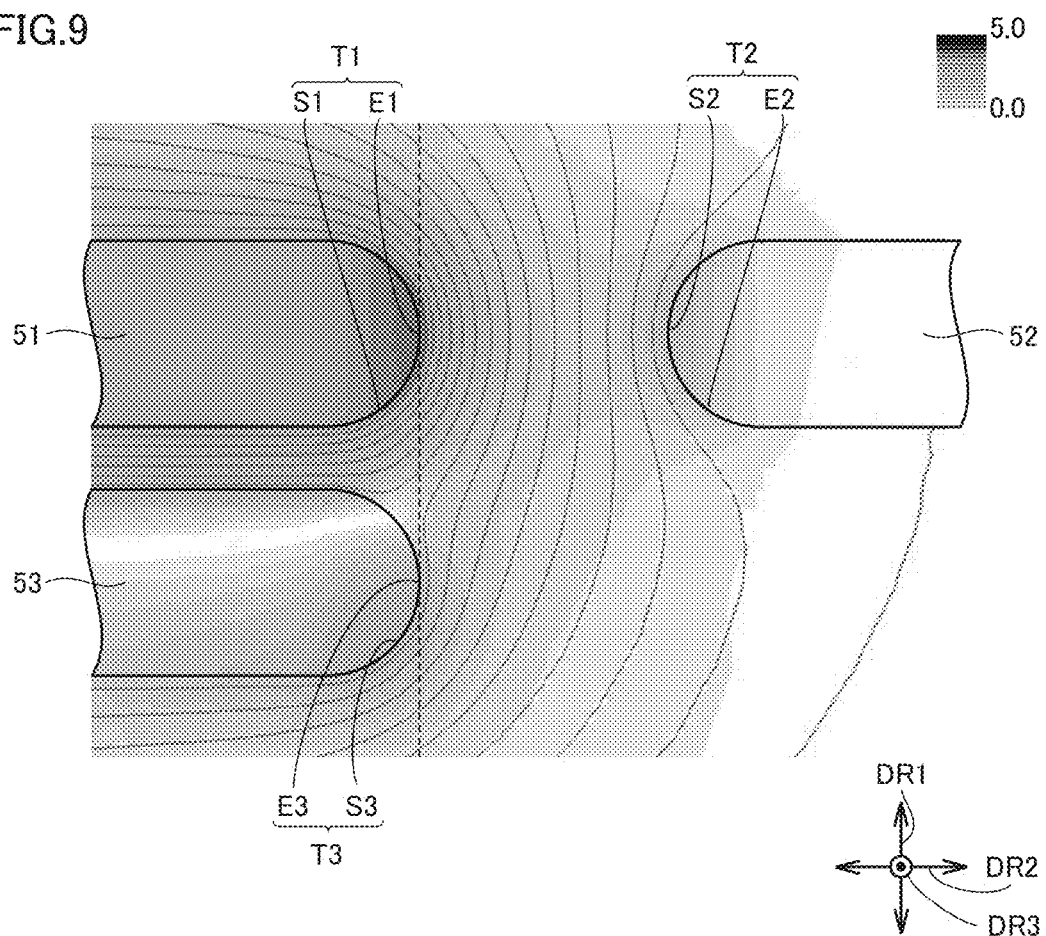
FIG. 9 is a contour diagram schematically illustrating an electric field generated around the first electric field relaxation shield, the second electric field relaxation shield, and the third electric field relaxation shield of the power conversion device according to the first embodiment.

In power conversion device 100 according to the first embodiment, as illustrated in FIG. 4, third end E3 is disposed at any position within a range from the position overlapping first end E1 to the position overlapping second end E2 when viewed from the direction (first direction DR1) in which first electric field relaxation shield 51 and third electric field relaxation shield 53 are overlapped each other. Therefore, as illustrated in FIG. 9, an electric field generated by first electric field relaxation shield 51 and second electric field relaxation shield 52 gradually changes. In particular, an electric field generated in the gap between first electric field relaxation shield 51 and second electric field relaxation shield 52 gradually changes. This is because the potential generated from first electric field relaxation shield 51 and second electric field relaxation shield 52 is shared by third end E3 of third electric field relaxation shield 53 having a floating potential. Note that, in the contour diagrams of FIGS. 9, 11, and 12, gray lines indicate equipotential lines. Further, in each of the contour diagrams, an electric field value of an electric field increases as a color of each region changes from white toward black. A color density of each region is divided into 10 levels. Assuming that the minimum electric field value is 0.0, and the maximum electric field value is 5.0, the electric field value of the fifth level is 2.5.

As illustrated in FIG. 9, according to the present embodiment, the electric field generated by first electric field relaxation shield 51 and second electric field relaxation shield 52 gradually changes around third side surface S3 of third termination portion T3 and around second side surface S2 of second termination portion T2. It is therefore possible to prevent a high electric field from being enhanced. Note that a mechanism capable of preventing a high electric field from being enhanced will be described later in detail with reference to a comparison with a first comparative example illustrated in FIGS. 10 and 11 and a second comparative example illustrated in FIG. 12.

Further, the potential generated from first electric field relaxation shield 51 and second electric field relaxation shield 52 is shared by third end E3 of third electric field relaxation shield 53 having a floating potential, so that it is possible to reduce the electric field value (high electric field) of the electric field between first electric field relaxation shield 51 and second electric field relaxation shield 52.

Further, since it is possible to prevent a high electric field from being enhanced, the occurrence of an electric discharge caused by the high electric field can be reduced. Note that, according to the present embodiment, the electric field value corresponds to electric field strength.

Figure 10:
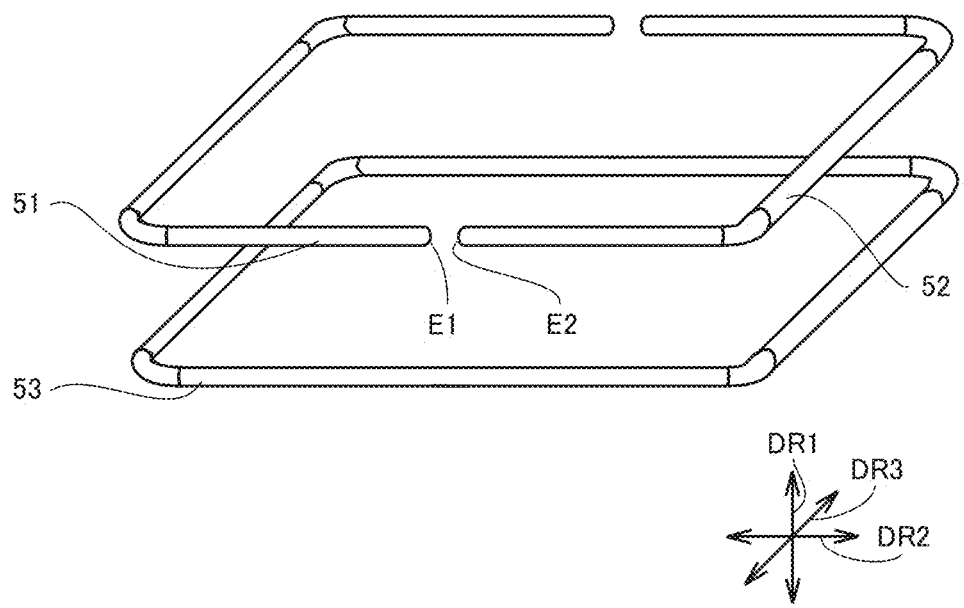
FIG. 10 is a schematic perspective view of configurations of a first electric field relaxation shield, a second electric field relaxation shield, and a third electric field relaxation shield of a power conversion device according to a first comparative example.

The actions and effects of the present embodiment will be described in detail with reference to a comparison between power conversion device 100 according to the present embodiment and a power conversion device according to the first comparative example illustrated in FIG. 10. As illustrated in FIG. 10, third electric field relaxation shield 53 of the power conversion device according to the comparative example has an annular shape. Accordingly, third electric field relaxation shield 53 is disposed so as to surround the plurality of power conversion units 1 (see FIG. 1) without any discontinuity. Third electric field relaxation shield 53 is disposed so as to cover the gap between first electric field relaxation shield 51 and second electric field relaxation shield 52 when viewed from the direction (first direction DR1) in which first electric field alleviation shield 51 and third electric field alleviation shield 53 are overlapped each other.

Figure 11:
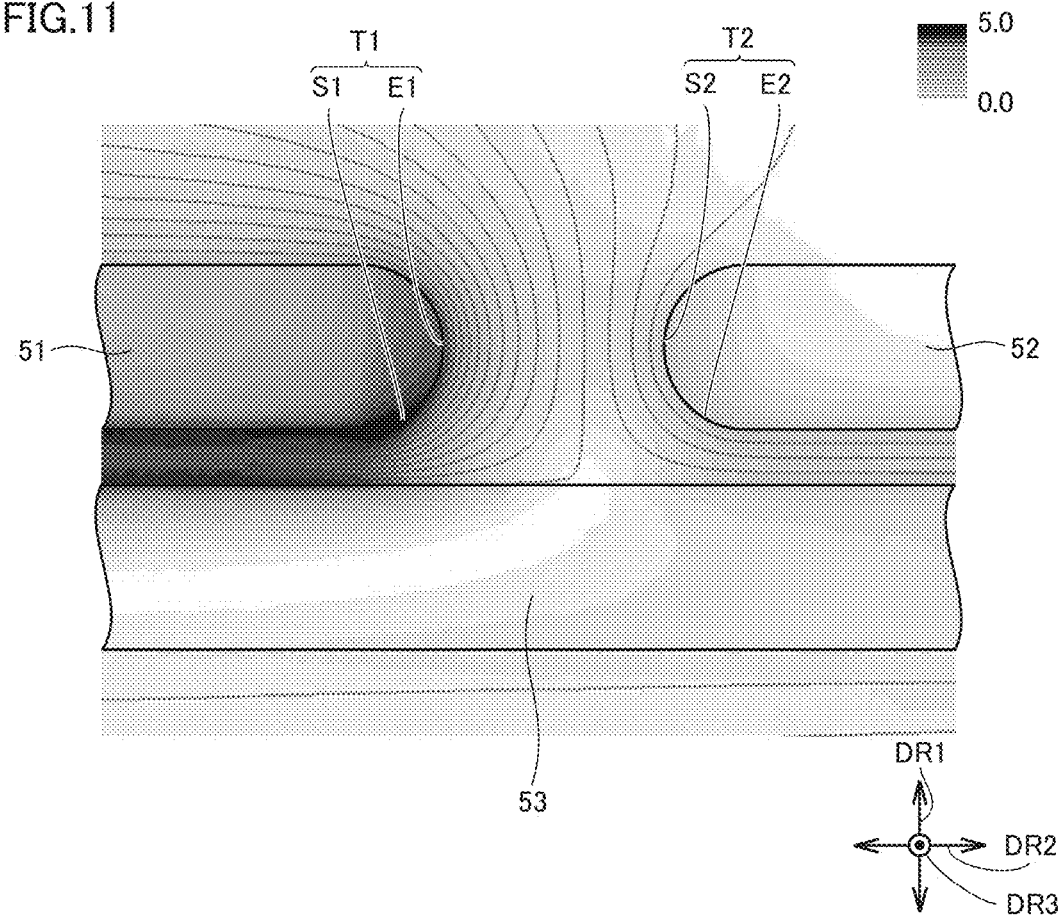
FIG. 11 is a contour diagram schematically illustrating an electric field generated around the first electric field relaxation shield, the second electric field relaxation shield, and the third electric field relaxation shield of the power conversion device according to the first comparative example.

According to the first comparative example, as illustrated in FIG. 11, the high electric field generated by first electric field relaxation shield 51 and second electric field relaxation shield 52 is enhanced by third electric field relaxation shield 53. In particular, the high electric field between first electric field relaxation shield 51 and third electric field relaxation shield 53 is enhanced by third electric field relaxation shield 53. That is, as an interval between the equipotential lines aligned between first electric field relaxation shield 51 and third electric field relaxation shield 53 decreases toward grounding object GP (see FIG. 1), the electric field is enhanced. This is because third electric field relaxation shield 53 separates first electric field relaxation shield 51 and second electric field relaxation shield 52 from grounding object GP (see FIG. 1), thereby preventing the interval between the aligned equipotential lines is prevented from gradually increasing toward grounding object GP (see FIG. 1). Further, the darkest (black) region illustrated in FIG. 11 is not present in FIG. 9. Therefore, the electric field of power conversion device 100 according to the present embodiment illustrated in FIG. 9 is lower in maximum electric field value than the electric field of power conversion device according to the first comparative example illustrated in FIG. 11.

On the other hand, in power conversion device 100 according to the present embodiment, as illustrated in FIG. 9, the potential generated from first electric field relaxation shield 51 and second electric field relaxation shield 52 is shared by third end E3 of third electric field relaxation shield 53 having a floating potential. Therefore, the interval between the equipotential lines between first electric field relaxation shield 51 and third electric field relaxation shield 53 becomes larger. It is therefore possible to prevent the high electric field from being enhanced.

The actions and effects of the present embodiment will be described with reference to a comparison between power conversion device 100 according to the present embodiment and a power conversion device according to the second comparative example (not illustrated).

Figure 12:
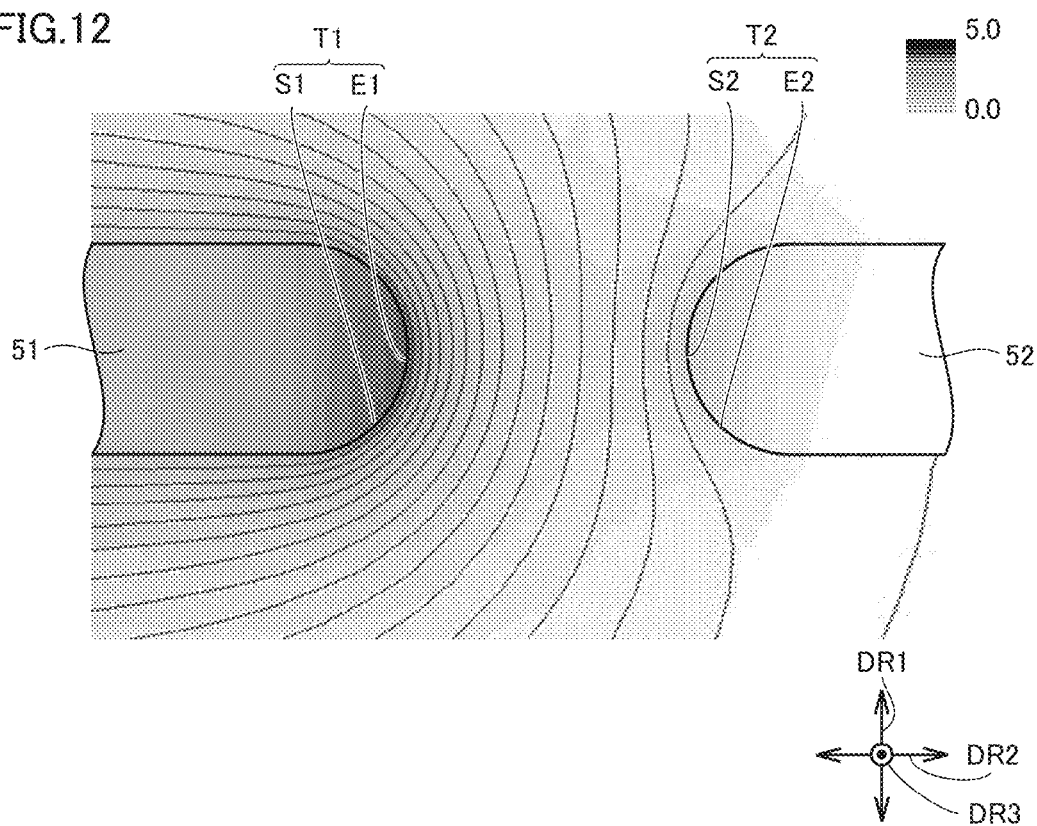
FIG. 12 is a contour diagram schematically illustrating an electric field generated around a first electric field relaxation shield and a second electric field relaxation shield of a power conversion device according to a second comparative example.

The power conversion device according to the second comparative example includes no third electric field relaxation shield 53. Therefore, as illustrated in FIG. 12, the potential generated from first electric field relaxation shield 51 and second electric field relaxation shield 52 is not shared by third electric field relaxation shield 53. This causes the electric field to advance to grounding object GP without being relaxed by third electric field relaxation shield 53. Therefore, according to the second comparative example, the high electric field is enhanced.

On the other hand, in power conversion device 100 according to the present embodiment, the electric field is shared by third electric field relaxation shield 53 having a floating potential. This allows the interval between the equipotential lines of the electric field to appropriately increase. Specifically, the interval between the equipotential lines increases in a direction from third electric field relaxation shield 53 to second electric field relaxation shield 52. It is therefore possible to prevent the high electric field from being enhanced as compared with the case where no third electric field relaxation shield 53 is provided.

As illustrated in FIG. 7, third end E3 is disposed at any position within a range from the position overlapping first end E1 to the position overlapping center point CP between first end E1 and second end E2 when viewed from the direction (first direction DR1) in which first electric field relaxation shield 51 and third electric field relaxation shield 53 are overlapped each other. It is therefore possible to prevent the high electric field from being farther enhanced.

With reference to a graph shown in FIG. 13, a description will be given in detail of a mechanism of the effect produced by the configuration where third end E3 is disposed at any position within a range from the position overlapping first end E1 to the position overlapping center point CP between first end E1 and second end E2 when viewed from the direction (first direction DR1) in which first electric field relaxation shield 51 and third electric field relaxation shield 53 are overlapped each other.

Figure 13:
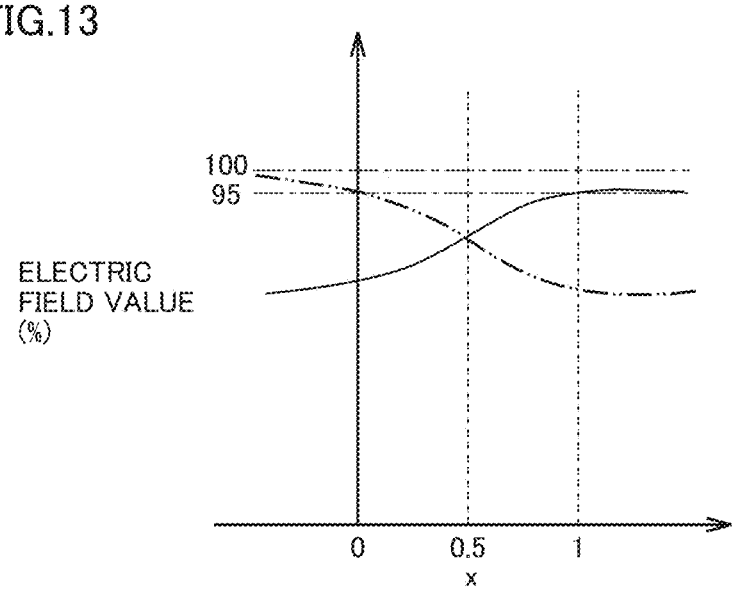
FIG. 13 is a graph schematically showing a relation between a position of a third end of the third electric field relaxation shield of the power conversion device according to the first embodiment and an electric field value of an electric field in a case where the position of the third end of the third electric field relaxation shield moves.

FIG. 13 is a graph showing changes in electric field when third end. E3 of third electric field relaxation shield 53 illustrated in FIG. 7 moves in the direction (second direction DR2) in which first end E1 and second end E2 face each other. A vertical axis indicates the electric field value. A horizontal axis indicates a position along an x axis of third end E3 of third electric field relaxation shield 53. As illustrated in FIGS. 7 and 13, a position of first end E1 in the direction (second direction DR2) in which first end E1 and second end E2 face each other is a first reference point (x=0). A position of second end E2 in the direction (second direction DR2) in which first end E1 and second end E2 face each other is a second reference point (x=1). A position of center point CP between first end E1 and second end E2 in the direction (second direction DR2) in which first end E1 and second end E2 face each other is a third reference point (x=0.5). A solid line indicates the electric field value of the electric field of first side surface S1 of first termination portion T1 of first electric field relaxation shield 51. A long dashed double-short dashed line indicates the electric field value of the electric field of first end E1 of first electric field relaxation shield 51. Two long dashed short dashed lines indicate, when the maximum electric field value of the electric field of first electric field relaxation shield 51 in a case where no third electric field relaxation shield 53 is provided is denoted as 100%, an electric field value of 100% and an electric field value of 95%.

According to the present embodiment, third end E3 is disposed at any position within a range of from the position overlapping first end E1 to the position overlapping center point CP between first end E1 and second end E2 when viewed from the direction (first direction DR1) in which first electric field relaxation shield 51 and third electric field relaxation shield 53 are overlapped each other. Therefore, third end E3 is disposed adjacent to the first reference point (x=0) relative to the third reference point (x=0.5). In a case where third end E3 is disposed adjacent to the first reference point (x=0) relative to third reference point (x=0.5), first end E1 is higher in electric field value than first side surface S1.

If third end E3 is disposed adjacent to the second reference point (x=1) relative to third reference point (x=0.5), first side surface S1 is higher in electric field than first end E1. This makes an electric discharge from first side surface S1 toward the ground likely to occur, so that the occurrence of an electric discharge to grounding object GP cannot be sufficiently reduced.

On the other hand, according to the present embodiment, third end E3 is disposed at any position within a range from the position overlapping first end E1 to the position overlapping center point CP between first end E1 and second end E2 when viewed from the direction (first direction. DR1) in which first electric field relaxation shield 51 and third electric field relaxation shield 53 are overlapped each other, so that it is possible to reduce the occurrence of an electric discharge from first side surface S1 to the ground. It is therefore possible to sufficiently reduce the occurrence of an electric discharge to grounding object GP.

As illustrated in FIG. 7, third end E3 of third electric field relaxation shield 53 protrude beyond the position overlapping first end E1 toward the position overlapping second end E2 when viewed from the direction (first direction DR1) in which first electric field relaxation shield 51 and third electric field relaxation shield 53 are overlapped each other. It is therefore possible to reduce the occurrence of an electric discharge as shown in FIG. 13.

If third end E3 is disposed on an inner side (x<0) relative to first end E1 when viewed from the direction (first direction DR1) in which first electric field relaxation shield 51 and third electric field relaxation shield 53 are overlapped each other, the maximum electric field value of third end E3 is greater than or equal to 95% and less than 100% of the maximum electric field value of first electric field relaxation shield 51 in a case where no third electric field relaxation shield 53 is provided. This makes the electric field relaxation effect produced due to the presence of third electric field relaxation shield 53 insufficient.

On the other hand, according to the present embodiment, third end E3 protrudes beyond the position overlapping first end E1 toward the position overlapping second end E2 when viewed from the direction (first direction DR1) in which first electric field relaxation shield 51 and third electric field relaxation shield 53 are overlapped each other, so that the electric field relaxation effect produced by third electric field relaxation shield 53 is sufficiently exerted. It is therefore possible to reduce the occurrence of an electric discharge.

Second Embodiment

Figure 14:
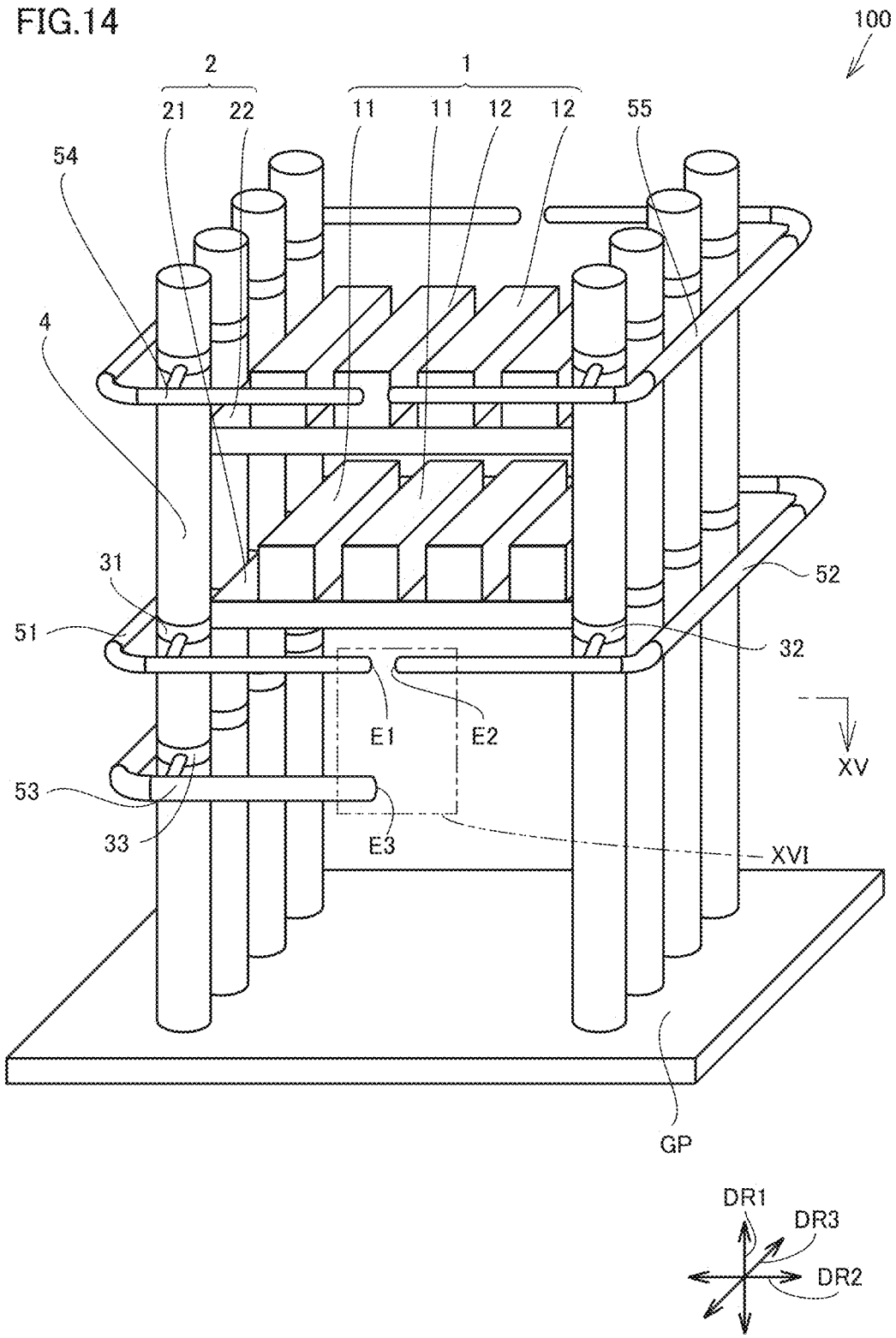
FIG. 14 is a schematic perspective view of a configuration of a power conversion device according to a second embodiment.
Figure 15:
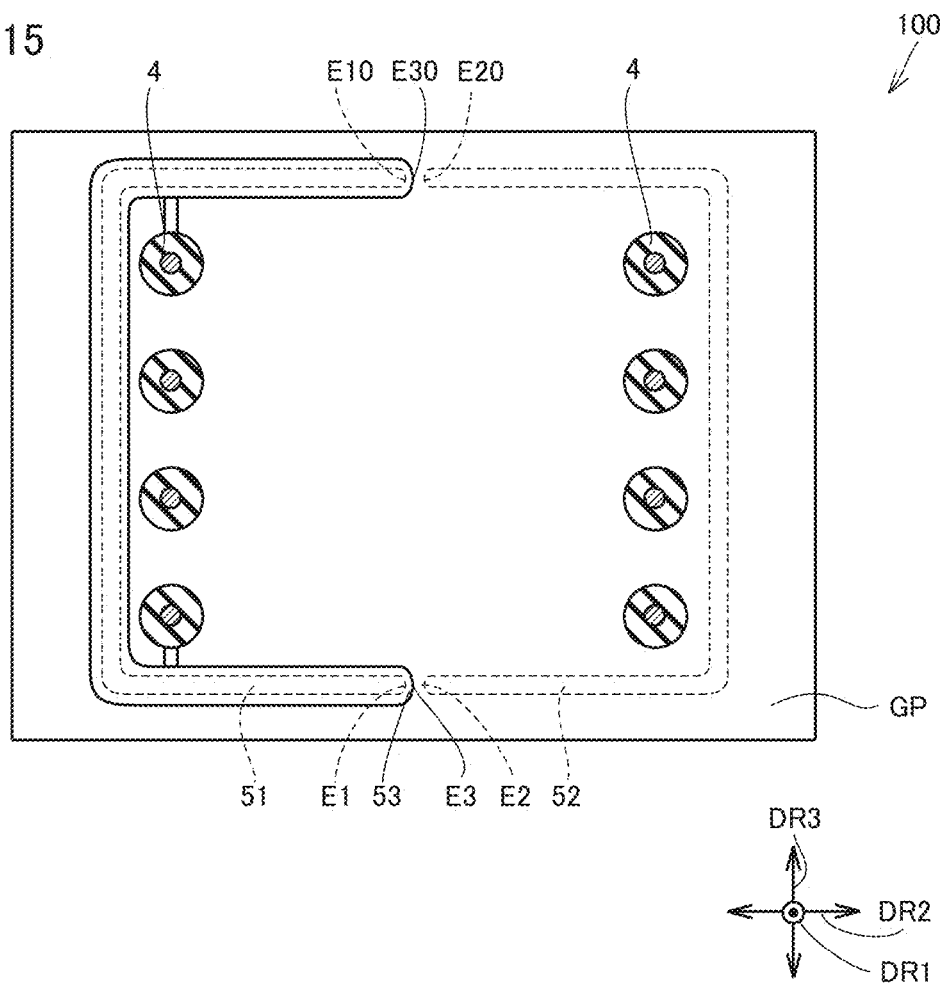
FIG. 15 is a cross-sectional view taken along a line XV-XV in FIG. 14.
Figure 16:
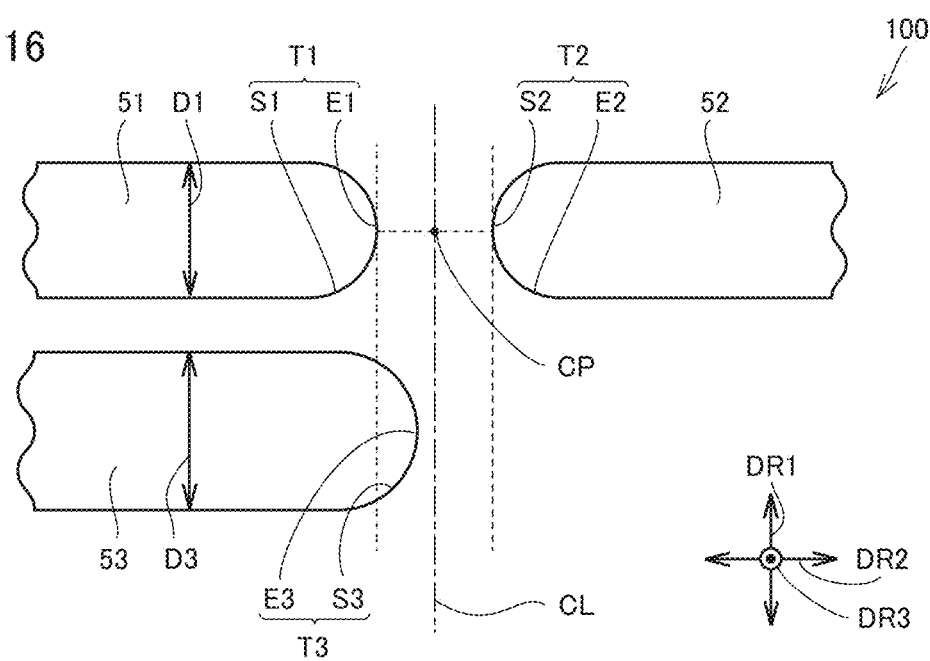
FIG. 16 is an enlarged view of a region XVI in FIG. 14.

With reference to FIGS. 14 to 16, a description will be given below of a configuration of a power conversion device 100 according to a second embodiment. The second embodiment is the same in configuration, and actions and effects as the first embodiment unless otherwise specified. Therefore, the same components as the components according to the first embodiment are denoted by the same reference numerals to avoid the description from being redundant.

As illustrated in FIGS. 14 and 15, in power conversion device 100 according to the second embodiment, an area of third electric field relaxation shield 53 facing first electric field relaxation shield 51 is larger than or equal to an area of first electric field relaxation shield 51. Specifically, as illustrated in FIG. 16, an outer diameter D3 of third electric field relaxation shield 53 is larger than or equal to an outer diameter D1 of first electric field relaxation shield 51, More specifically, as illustrated in FIGS. 14 to 16, outer diameter D3 of third electric field relaxation shield 53 is larger than outer diameter D1 of first electric field relaxation shield 51. Therefore, the area of third electric field relaxation shield 53 facing first electric field relaxation shield 51 is larger than the area of first electric field relaxation shield 51. The larger the outer diameter of third electric field relaxation shield 53, the larger the area of third electric field relaxation shield 53 facing first electric field relaxation shield 51, Note that, in FIG. 15, the outline of first electric field relaxation shield 51 and the outline of second electric field relaxation shield 52 are indicated by dashed lines.

The electric field generated in power conversion device 100 according to the present embodiment will be described. First electric field relaxation shield 51 and third electric field relaxation shield 53 according to the present embodiment have a cylindrical shape, and grounding object GP has a plate shape, so that the electric field will be described on the assumption that third electric field relaxation shield 53 and grounding object GP constitute a so-called cylinder-plate system in which a cylinder and a plate face each other. Further, the electric field will be described on the assumption that first electric field relaxation shield 51 and third electric field relaxation shield 53 constitute a so-called cylinder-cylinder system in which cylinders face each other.

There is an index called a nonuniformity rate indicating how an electric field is nonuniform. The nonuniformity rate is determined by the following formula.

nonuniformity rate=(maximum electric field value within space of system)/(average electric field value within space of system).

For example, in the plate-plate system in which two plates face each other, the electric field generated in the space is uniform, Therefore, in the plate-plate system, the nonuniformity rate is 1.

On the other hand, in the cylinder-plate system and the cylinder-cylinder system as in the present embodiment, the electric field distribution becomes nonuniform. Specifically, in the cylinder-plate system, the cylinder is extremely high in electric field, and the plate is low in electric field. Accordingly, the closer to the plate, the lower the electric field. Note that, at the cylinder, the maximum electric field is generated, A specific nonuniformity rate is determined in a manner that depends on a shape of the cylinder and a distance between the cylinder and the plate, but in the cylinder-plate system, the nonuniformity rate is greater than 1. The smaller the outer diameter of the cylinder, the greater the nonuniformity rate. Further, the larger the distance between the cylinder and the plate, the greater the nonuniformity rate.

On the other hand, the larger the outer diameter of the cylinder, the closer the shape of the system is to the plate-plate system, and thus the nonuniformity rate decreases. That is, the larger the outer diameter of the cylinder, the closer the nonuniformity rate is to 1. In other words, the closer the nonuniformity rate is to 1, the lower the maximum electric field of the system, and the maximum electric field of the system becomes close to the average electric field.

According to the second embodiment, outer diameter D3 of third electric field relaxation shield 53 is larger than outer diameter D1 of first electric field relaxation shield 51, so that the nonuniformity rate becomes low as compared with a case where outer diameter D1 of first electric field relaxation shield 51 and outer diameter D3 of third electric field relaxation shield 53 are identical to each other. Therefore, the electric field generated at third electric field relaxation shield 53 becomes low as compared with the case where outer diameter D1 of first electric field relaxation shield 51 and outer diameter D3 of third electric field relaxation shield are identical to each other.

Note that the case where first electric field relaxation shield 51 and third electric field relaxation shield 53 each have a cylindrical shape has been described, but the shape of first electric field relaxation shield 51 and the shape of third electric field relaxation shield 53 are not limited to such a cylindrical shape. First electric field relaxation shield 51 and third electric field relaxation shield 53 may have a different shape such as a plate shape. Further, the end of first electric field relaxation shield 51 and the end of third electric field relaxation shield 53 may have a different shape such as an annular shape formed by rounding a cylinder.

Next, actions and effects of the present embodiment will be described.

In power conversion device 100 according to the second embodiment, as illustrated in FIG. 15, the area of third electric field relaxation shield 53 facing first electric field relaxation shield 51 is larger than or equal to the area of first electric field relaxation shield 51. It is therefore possible to make the electric field generated at third electric field relaxation shield 53 lower. This in turn makes it possible to reduce the occurrence of an electric discharge.

The effects of the present embodiment will be described in detail with reference to a graph of FIG. 17. In the graph shown in FIG. 17, a vertical axis indicates the electric field value of the electric field generated at first electric field relaxation shield 51 and third electric field relaxation shield 53. A horizontal axis indicates outer diameter D3 of third electric field relaxation shield 53. A long dashed double-short dashed line indicates the maximum electric field value of third side surface S3 (see FIG. 16) of third electric field relaxation shield 53. A dashed line indicates the maximum electric field value of first electric field relaxation shield 51 in a case where power conversion device 100 includes no third electric field relaxation shield 53.

Figure 17:
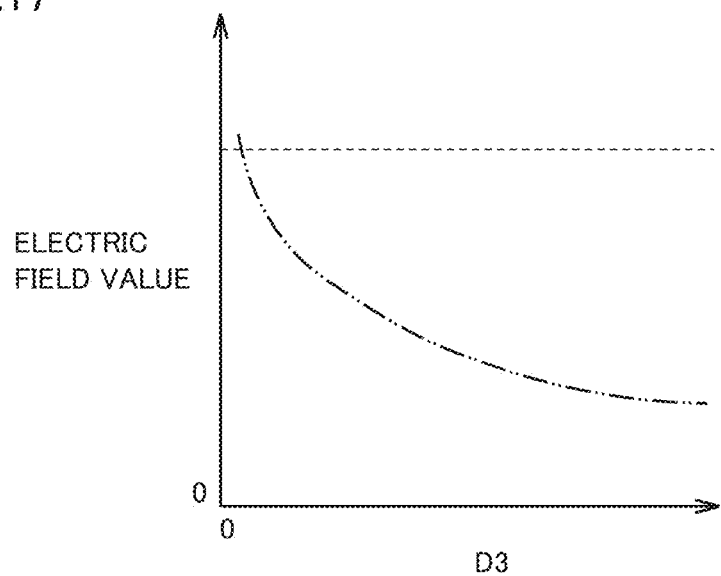
FIG. 17 is a graph schematically showing a relation between a radius of a third electric field relaxation shield of the power conversion device according to the second embodiment and an electric field value of an electric field.

As illustrated in FIGS. 16 and 17, the larger the outer diameter of third electric field relaxation shield 53, the lower the electric field value of the electric field of third side surface S3. Accordingly, the electric field value of the electric field from third side surface S3 of third electric field relaxation shield 53 toward grounding object OP (see FIG. 14) decreases. It is therefore possible to reduce the occurrence of an electric discharge from third electric field relaxation shield 53 to grounding object GP.

As illustrated in FIG. 16, outer diameter D3 of third electric field relaxation shield 53 is larger than or equal to outer diameter D1 of first electric field relaxation shield 51. Accordingly, the area of third electric field relaxation shield 53 facing first electric field relaxation shield 51 is larger than or equal to the area of first electric field relaxation shield 51. It is therefore possible to reduce the occurrence of an electric discharge from third electric field relaxation shield 53 to grounding object GP.

Third Embodiment

Figure 18:
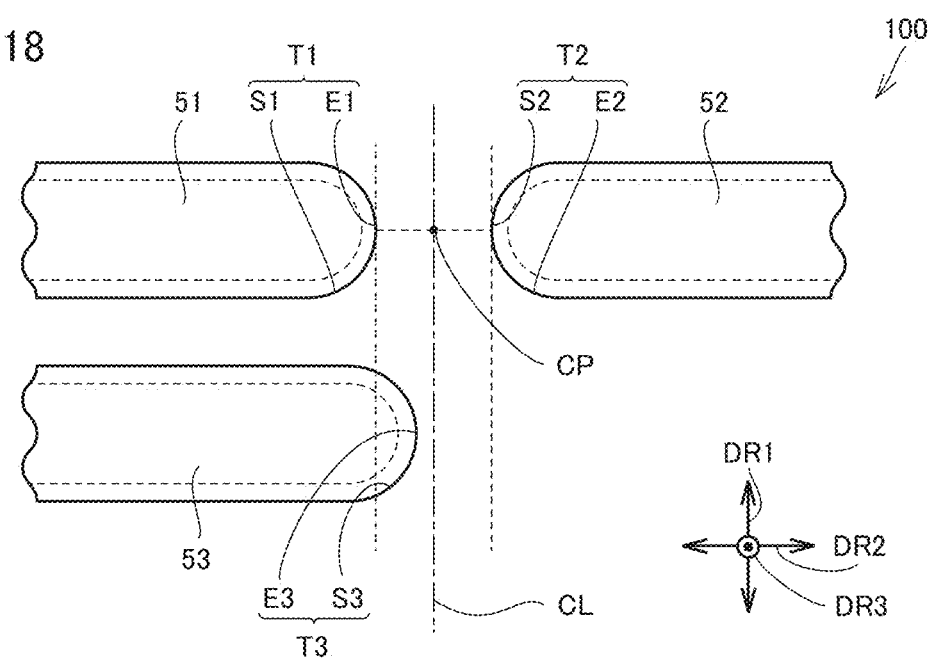
FIG. 18 is a schematic enlarged view of a configuration of a power conversion device according to a third embodiment.

With reference to FIG. 18, a description will be given below of a configuration of a power conversion device 100 according to a third embodiment. The third embodiment is the same in configuration, and actions and effects as the first embodiment unless otherwise specified. Therefore, the same components as the components according to the first embodiment are denoted by the same reference numerals to avoid the description from being redundant.

As illustrated in FIG. 18, in power conversion device 100 according to the third embodiment, at least any one of first electric field relaxation shield 51, second electric field relaxation shield 52, or third electric field relaxation shield 53 has a hollow structure. It is preferable that, as illustrated in FIG. 18, first electric field relaxation shield 51, second electric field relaxation shield 52, and third electric field relaxation shield 53 each have a hollow structure. In FIG. 18, first electric field relaxation shield 51, second electric field relaxation shield 52, and third electric field relaxation shield 53 are each formed of a hollow tubular member (cylindrical member). In FIG. 18, respective inner walls of first electric field relaxation shield 51, second electric field relaxation shield 52, and third electric field relaxation shield 53 are indicated by dashed lines. Note that first end E1, second end E2, and third end E3 are each formed of a conductive member. That is, first end E1, second end E2, and third end E3 are not hollow.

Although not illustrated, the electric field relaxation shield may have a plate-like structure. In a case where the electric field relaxation shield has a plate-like structure, the electric field relaxation shield is formed of, for example, a mesh-like member interwoven with a metal wire or conductive plastics. In a case where the electric field relaxation shield is formed of a mesh-like member, it is desirable that a cut end of the mesh-like member do not extend toward the ground potential. This makes it possible to prevent the effect of relaxing an electric field from being reduced by the cut end.

Next, actions and effects of the present embodiment will be described.

In power conversion device 100 according to the third embodiment, as illustrated in FIG. 18, at least any one of first electric field relaxation shield 51, second electric field relaxation shield 52, or third electric field relaxation shield 53 has a hollow structure. It is therefore possible to make power conversion device 100 light in weight as compared with a case where first electric field relaxation shield 51, second electric field relaxation shield 52, and third electric field relaxation shield 53 do not have a hollow structure. That is, power conversion device 100 can be made light in weight as compared with a case Where first electric field relaxation shield 51, second electric field relaxation shield 52, and third electric field relaxation shield 53 are solid.

It should be understood that the embodiments disclosed herein are illustrative in all respects and not restrictive. The scope of the present disclosure is defined by the claims rather than the above description, and the present disclosure is intended to include the claims, equivalents of the claims, and all modifications within the scope.

REFERENCE SIGNS LIST

1: power conversion unit, 51: first electric field relaxation shield, 52: second electric field relaxation shield, 53: third electric field relaxation shield, 100: power conversion device, E1: first end, E2: second end, E3: third end, GP: grounding object

The invention claimed is:

1. A power conversion device comprising:
a plurality of power conversion units disposed away from a grounding object that is at a ground potential;
a first electric field relaxation shield disposed between the grounding object and the plurality of power conversion units, the first electric field relaxation shield including a first end;
a second electric field relaxation shield including a second end facing the first end with a gap, the second electric field relaxation shield being disposed between the grounding object and the plurality of power conversion units; and
a third electric field relaxation shield disposed between the grounding object and the first electric field relaxation shield so as to be overlapped with the first electric field relaxation shield, the third electric field relaxation shield including a third end, wherein
the first electric field relaxation shield and the second electric field relaxation shield surround the plurality of power conversion units when viewed from a direction in which the first electric field relaxation shield and the third electric field relaxation shield are overlapped with each other, and
the third end includes a protruding portion beyond a position overlapping the first end toward a position overlapping the second end when viewed from the direction in which the first electric field relaxation shield and the third electric field relaxation shield are overlapped with each other.

2. The power conversion device according to claim 1, wherein
the first electric field relaxation shield is higher in potential than the second electric field relaxation shield, and
the protruding portion is disposed at a position equal to a center point between the first end and the second end, or on the first end side of the center point when viewed from the direction in which the first electric field relaxation shield and the third electric field relaxation shield are overlapped with each other.

3. The power conversion device according to claim 2, wherein
an area of the third electric field relaxation shield facing the first electric field relaxation shield is larger than or equal to an area of the first electric field relaxation shield.

4. The power conversion device according to claim 2, wherein
at least any one of the first electric field relaxation shield, the second electric field relaxation shield, or the third electric field relaxation shield has a hollow structure.

5. The power conversion device according to claim 2, wherein
the first electric field relaxation shield has a hollow structure.

6. The power conversion device according to claim 2, wherein
the second electric field relaxation shield has a hollow structure.

7. The power conversion device according to claim 2, wherein
the third electric field relaxation shield has a hollow structure.

8. The power conversion device according to claim 1, wherein
an area of the third electric field relaxation shield facing the first electric field relaxation shield is larger than or equal to an area of the first electric field relaxation shield.

9. The power conversion device according to claim 8, wherein
an outer diameter of the third electric field relaxation shield is larger than or equal to an outer diameter of the first electric field relaxation shield.

10. The power conversion device according to claim 9, wherein
at least any one of the first electric field relaxation shield, the second electric field relaxation shield, or the third electric field relaxation shield has a hollow structure.

11. The power conversion device according to claim 8, wherein
at least any one of the first electric field relaxation shield, the second electric field relaxation shield, or the third electric field relaxation shield has a hollow structure.

12. The power conversion device according to claim 1, wherein
at least any one of the first electric field relaxation shield, the second electric field relaxation shield, or the third electric field relaxation shield has a hollow structure.

13. The power conversion device according to claim 1, further comprising:
a fourth electric field relaxation shield; and
a fifth electric field relaxation shield,
wherein the fourth electric field relaxation shield and the fifth electric field relaxation shield are located above the plurality of power conversion units, and the fourth electric field relaxation shield and the fifth electric field relaxation shield surround the plurality of power conversion units.

* * * * *